(12) United States Patent
Goerlach et al.

(10) Patent No.: US 7,902,626 B2
(45) Date of Patent: Mar. 8, 2011

(54) SEMICONDUCTOR DEVICE AND METHOD FOR ITS MANUFACTURE

(75) Inventors: Alfred Goerlach, Kusterdingen (DE); Ning Qu, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 439 days.

(21) Appl. No.: 11/792,896

(22) PCT Filed: Oct. 13, 2005

(86) PCT No.: PCT/EP2005/055227
§ 371 (c)(1),
(2), (4) Date: Oct. 15, 2008

(87) PCT Pub. No.: WO2006/061277
PCT Pub. Date: Jun. 15, 2006

(65) Prior Publication Data
US 2009/0032897 A1    Feb. 5, 2009

(30) Foreign Application Priority Data
Dec. 10, 2004  (DE) .................. 10 2004 059 640

(51) Int. Cl.
*H01L 29/872* (2006.01)
(52) U.S. Cl. .................. 257/476; 257/109; 257/E27.051
(58) Field of Classification Search .................. 257/109, 257/476, E27.051
See application file for complete search history.

(56) References Cited

U.S. PATENT DOCUMENTS

| 4,982,260 | A |   | 1/1991 | Chang et al. |
| 5,262,668 | A |   | 11/1993 | Tu et al. |
| 6,049,108 | A | * | 4/2000 | Williams et al. ............. 257/341 |
| 6,078,090 | A |   | 6/2000 | Williams et al. |
| 6,351,018 | B1 | * | 2/2002 | Sapp ............................ 257/499 |
| 6,362,495 | B1 |   | 3/2002 | Schoen et al. |
| 6,501,146 | B1 |   | 12/2002 | Harada |
| 6,562,706 | B1 |   | 5/2003 | Liu et al. |
| 6,593,620 | B1 | * | 7/2003 | Hshieh et al. ................ 257/335 |
| 6,605,854 | B2 | * | 8/2003 | Nagase et al. ............... 257/476 |
| 6,806,548 | B2 | * | 10/2004 | Shirai et al. .................. 257/473 |

(Continued)

FOREIGN PATENT DOCUMENTS

EP    1 139 433    10/2001

(Continued)

OTHER PUBLICATIONS

International Search Report, PCT International Patent Application No. PCT/EP2005/055227, dated Feb. 16, 2006.

*Primary Examiner* — Allan R Wilson
(74) *Attorney, Agent, or Firm* — Kenyon & Kenyon LLP

(57) ABSTRACT

In semiconductor devices and methods for their manufacture, the semiconductor devices are arranged as a trench-Schottky-barrier-Schottky diode having a pn diode as a clamping element (TSBS-pn), and having additional properties compared to usual TSBS elements which make possible adaptation of the electrical properties. The TSBS-pn diodes are produced using special manufacturing methods, are arranged in their physical properties such that they are suitable for use in a rectifier for a motor vehicle generator, and are also able to be operated as Z diodes.

10 Claims, 2 Drawing Sheets

U.S. PATENT DOCUMENTS

| | | | |
|---|---|---|---|
| 6,855,593 B2 * | 2/2005 | Andoh et al. | 438/237 |
| 7,186,609 B2 * | 3/2007 | Korec et al. | 438/221 |
| 2002/0008237 A1 | 1/2002 | Chang et al. | |
| 2002/0125541 A1 * | 9/2002 | Korec et al. | 257/471 |
| 2004/0256690 A1 * | 12/2004 | Kocon | 257/471 |
| 2008/0128850 A1 * | 6/2008 | Goerlach et al. | 257/476 |
| 2008/0197439 A1 * | 8/2008 | Goerlach et al. | 257/476 |

FOREIGN PATENT DOCUMENTS

| | | |
|---|---|---|
| JP | 61-166164 | 7/1986 |
| JP | 5-259436 | 10/1993 |
| JP | 6-151816 | 5/1994 |
| JP | 8-116072 | 5/1996 |
| JP | 2001-284604 | 10/2001 |

* cited by examiner

SEMICONDUCTOR DEVICE AND METHOD FOR ITS MANUFACTURE

FIELD OF THE INVENTION

The present invention is directed to a semiconductor device as well as to a method for its manufacture. With regard to the semiconductor device of the species, a trench-Schottky-barrier-Schottky diode is involved.

BACKGROUND INFORMATION

In modern motor vehicles, ever more functions are implemented using electrical components. This causes an ever rising requirement for electrical power. In order to cover this requirement, the efficiency of the generator system in the motor vehicle has to be increased.

Up to now, pn diodes have been used, as a rule, as Z diodes in the motor vehicle generator system as rectifiers. The advantages of the pn diodes are low blocking-state current and robustness. The main disadvantage of pn diodes is the high forward voltage UF. At room temperature, the current only begins to flow at UF=0.7V. And under normal operating conditions, for instance, at a current density of 500 A/cm$^2$, UF rises to over 1 V, which means a nonnegligible loss in efficiency.

In theory, the Schottky diode is available as an alternative. Schottky diodes have a clearly lower forward voltage than pn diodes, such as 0.5 V to 0.6 V at a high current density of 500 A/cm$^2$. In addition, Schottky diodes, as majority carrier components, offer advantages in rapid switching operation. The use of Schottky diodes in motor vehicle generator systems has, however, still not taken place. This must be attributed to a few decisive disadvantages of Schottky diodes: 1) higher blocking-state current in comparison to pn diodes, 2) strong dependence of the blocking-state current of the reverse voltage, and 3) poor robustness, especially at high temperature.

The usual Schottky diodes can be changed in their electrical properties by applying trenches implemented by etching. Such further developed Schottky diodes are also designated as trench-Schottky-barrier-Schottky diodes (TSBS). An example of such a conventional semiconductor device is shown in FIG. 1. However, the conventional trench-Schottky-barrier-Schottky diodes do not have the requisite robustness they need in order to be used as Z diodes in motor vehicle generator systems.

SUMMARY

Semiconductor devices according to example embodiments of the present invention, on the other hand, have the advantage of high robustness, and are therefore suitable for being used as Z diodes in motor vehicle generator systems.

These advantages are achieved by furnishing a trench-Schottky-barrier-Schottky diode (TSBS diode) with an integrated pn diode as clamping element. The additional p wells, in this context, are dimensioned so that the breakdown voltage of the pn diode is lower than the breakdown voltage of the Schottky diode.

By arranging the trench-Schottky-barrier-Schottky diode (TSBS diode) to have an integrated pn diode as clamping element (TSBS-pn), it is possible to operate the diode as a Z diode. At a breakdown voltage of the Z diode of approximately 20 Volt, it is suitable for use in a motor vehicle generator system and can be used as a rectifying element for the rectifier of the generator.

The manufacture of the semiconductor devices according to variant 1 or variant 2 is accomplished using suitable methods that are adapted to the different variants.

DETAILED DESCRIPTION

Figure 1:
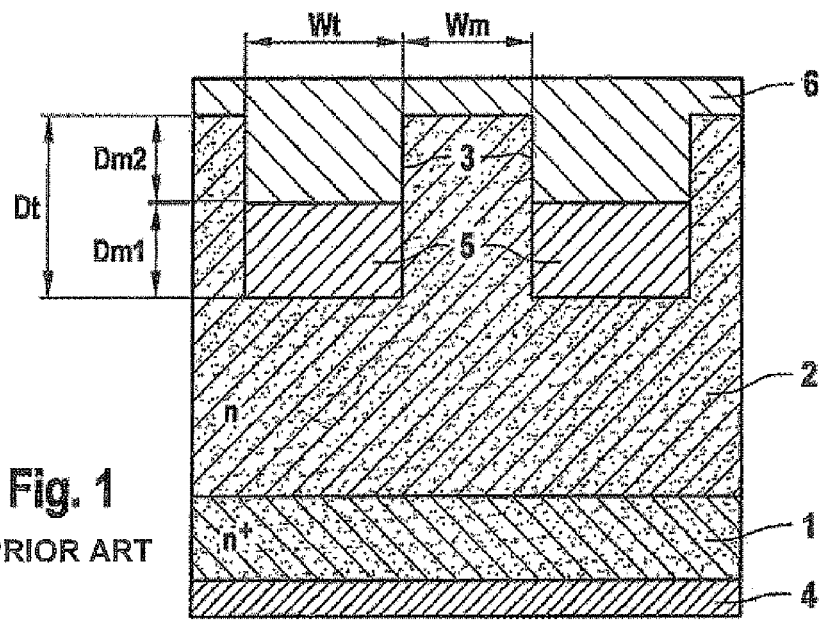
FIG. 1 shows a conventional trench-Schottky-barrier-Schottky diode (TSBS).

As FIG. 1 shows, the trench-Schottky-barrier-Schottky diode (TSBS) is made up of an n$^+$ substrate 1, an n-doped epilayer, at least two trenches 3 of a depth Dt, implemented in the n-epilayer 2 by etching, and a metallic layer 4 on the back surface of the chip as ohmic contact or cathode electrode. The two trenches 3 are first filled in using a metal 5 of a thickness Dm1 and this is subsequently covered using a second metal 6. Second metal 6 fills the rest of the trenches at a thickness Dm2. The two metals 5 and 6 on the front side of the chip are used as Schottky contacts or an anode electrode.

Second metal 6, as a rule, has a smaller barrier height than first metal 5. Therefore, from an electrical point of view, the TSBS is a combination of two Schottky diodes having different barrier heights: a Schottky diode having a Schottky barrier between metal 5 as anode and n-epilayer 2 as cathode, and a second Schottky diode having a Schottky barrier between metal 6 as anode and n-epilayer 2 as cathode.

In the forward direction, at least when the barrier heights of the two metals are clearly different, currents flow chiefly to upper metal 6 that has the lower barrier, even at the corresponding sidewalls of the trenches. Provided Dm2>Wt applies, the effective surface for the current flow in the flow direction in a TSBS is greater in comparison to a conventional planar Schottky diode.

In the blocking direction, first metal 5, with its greater barrier height, provides great expansion of the space charge region. The space charge regions expand with increasing voltage and, at a voltage that is less than the breakdown voltage of the TSBS, they collide in the middle of the region between adjacent trenches 3. The Schottky effects responsible for high blocking-state currents are screened off thereby, and the blocking-state currents are reduced. This screening effect is greatly dependent on structural parameters Dt (the depth of the trench), Wm (the distance between the trenches), Wt (the width of the trench), as well as on Dm1 (the thickness of first metal 5), see FIG. 1. The expansion of the space charge regions in the mesa region between trenches 3 is virtually unidimensional, if Dt is clearly greater than Wm.

The specialty of a TSBS is the combination of the two metals, which makes possible a certain separation of the designs with respect to requirements on forward voltage and screening response. Forward voltage UF and the initial value of blocking-state current IRO are influenced primarily by second metal 6 that has the lower barrier. The greater the proportion of second metal 6, the lower is UF, and the higher is IRO. On the other hand, first metal 5, having the greater barrier, determines the voltage dependence of the blocking-state current, the breakdown voltage and the current distribution at high blocking-state currents. Therefore, TSBS offers a possibility of optimization by combination of the two metals. Both thicknesses DM1 and DM2 and the barrier heights of the two metals can be used as parameters.

However, a certain disadvantage of TSBS is the weakness of the Schottky contacts at the trench floor, since there, strong electric fields, and consequently also high blocking-state densities are created. Because of the inhomogeneity of the boundary layer at the trench floor, it is not recommended to use TSBS as Z diodes and to use them in the breakdown range (drifting, Q risk).

Such TSBS elements are manufactured as follows: Implementation of trenches 3 by etching n-epilayer 2, filling in trenches 3 with first metal 5, and, if necessary, etching back the first metal to a specified thickness, and filling in the rest of the trenches using second metal 6.

Figure 2:
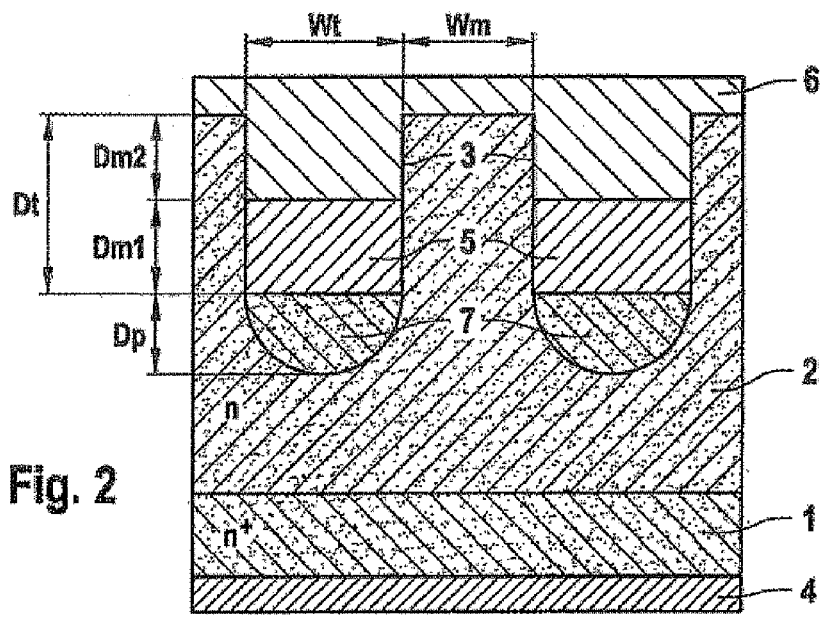
FIG. 2 shows an exemplary embodiment of the present invention having a trench-Schottky-barrier-Schottky diode having an integrated pn diode as clamping element (TSBS-pn) having p-doped silicon or polysilicon in the lower region of the trenches.
Figure 3:
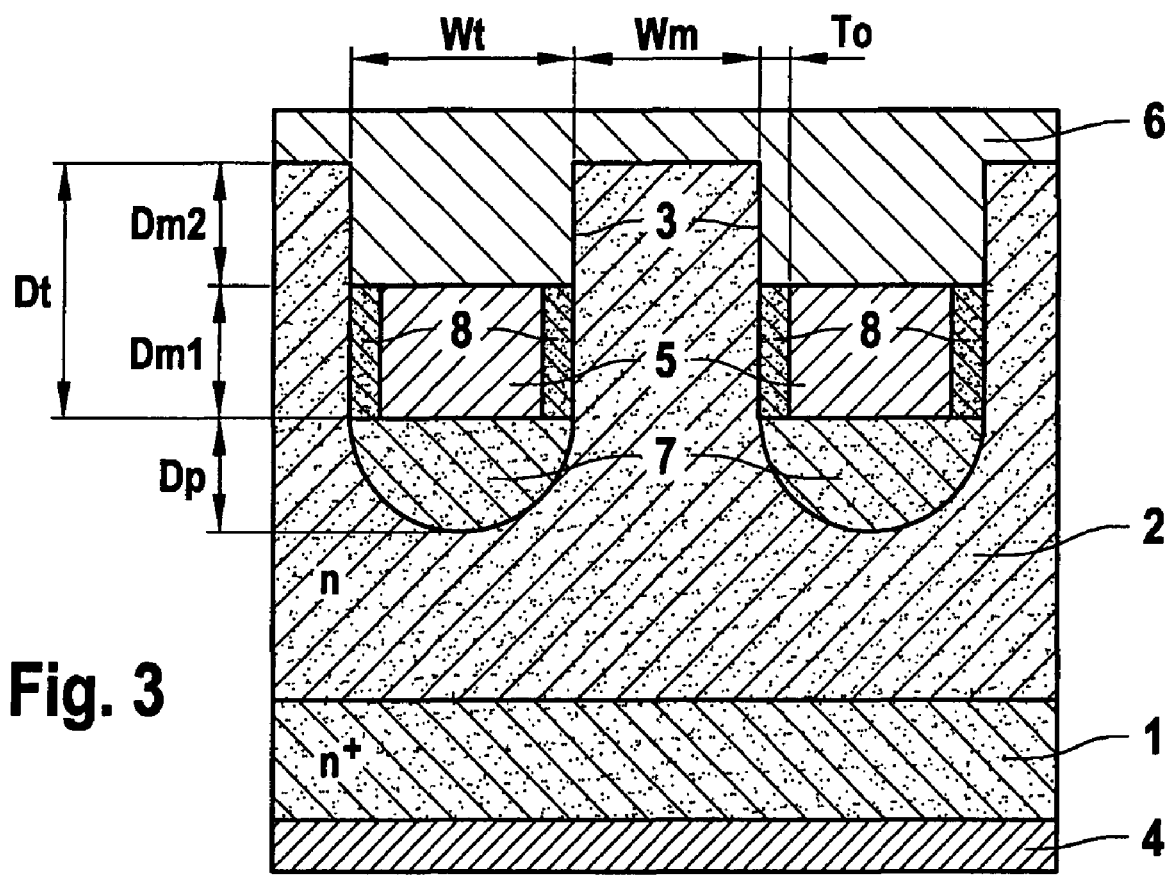
FIG. 3 shows an exemplary embodiment of the present invention having a trench-Schottky-barrier-Schottky diode having an integrated pn diode as clamping element (TSBS-pn) having a-barrier oxide and p-doped silicon or polysilicon in the lower region of the trenches (TSBS-BOpn).

Example embodiments of the present invention are shown in FIGS. 2 and 3.

Variant 1: A trench-Schottky-barrier-Schottky diode having an integrated pn diode as clamping element (TSBS-pn), having p-doped silicon or polysilicon in the lower region of the trenches is shown in FIG. 2.

As shown, the TSBS-pn of an exemplary embodiment of the present invention is made up of an $n^+$ substrate 1, an n-epilayer 2, at least two trenches 3 of depth Dt etched into n-epilayer 2, and a metal layer 4 on the back surface of the chip as ohmic contact or cathode electrode. Lower region 7 of trenches 3 is filled in using p-doped Si or poly-Si up to a height of Dp. The trenches are then filled in using a metal 5 of a thickness Dm1, using an ohmic contact to p-doped Si or poly-Si 7, and using a Schottky contact to n-epilayer 2 (anode electrode) and subsequently covered using second metal 6. Second metal 6 fills in the rest of the trenches at a thickness of Dm2, having Schottky contact to n-epilayer 2, and is also used as an anode electrode. From an electrical point of view, TSBS-pn is a combination of two Schottky diodes having different barrier heights and a pn diode having p-wells 7 as anode and n-epilayer 2 as cathode.

In the TSBS-pn, the currents flow in the forward direction only through the upper Schottky diode. The lower Schottky diode and the pn diode are not available. The Schottky contacts at the sidewalls of the trenches take care of a greater effective surface for the current flows in the forward direction, in comparison to conventional planar Schottky diodes, provided 2Dm2>Wt applies. In the blocking direction, space charge regions develop, both in the case of the Schottky barriers and the p-n junction. The space charge regions expand with increasing voltage and, at a voltage that is less than the breakdown voltage of the TSBS-pn, they collide in the middle of the region between adjacent trenches 3. The Schottky effects responsible for high blocking-state currents are screened off thereby, and the blocking-state currents are reduced. This screening effect is greatly dependent upon structural parameters Wm (clearance between the trenches), Wt (width of the trenches or the p-wells), Dp (depth of the trench proportion having p-doped Si or poly-Si; corresponds to the thickness of the p-wells), as well as DM1 (thickness of first metal 5), see FIG. 2.

TSBS-pn has similar screening effects of Schottky effects as does TSBS, but in addition, it offers great robustness because of the integrated clamping function of the pn diode. The breakdown voltage of the pn diode, BV_pn is configured such that BV_pn is lower than the breakdown voltage of the Schottky diodes BV_schottky. The breakdown takes place at the trench floor, and the breakdown voltage of TSBS-pn is determined by BV_pn. Therefore, there is no high field strength in the vicinity of Schottky contacts, and the blocking-state currents in breakdown operation then only flow through the p-n junction, and not through the Schottky contacts, as in a conventional TSBS. With that, TSBS-pn has the robustness of a pn diode. As a result, TSBS-pn is quite suitable as a Z diode.

Manufacturing Method of TSBS-pn, Variant 1

Step 1: monocrystalline $n^+$ substrate is used as starting material.

Step 2: the also monocrystalline n-doped layer 2 is applied in an epitaxy method.

Step 3: trenches 3 are etched into layer 2, using trench etching.

Step 4: filling in trenches 3 takes place using p-doped Si or poly-Si.

Step 5: if necessary, partial etching of a part of the p-doped Si or poly-Si in trenches 3.

Step 6: filling in trenches 3 with first metal 5.

Step 7: if necessary, etching first metal 5 down to a specified thickness.

Step 8: filling in the rest of trenches 3 with second metal 6.

Step 9: metalizing on the back surface, that is, applying metal layer 4 to the back surface of the chip.

FIG. 3 shows an exemplary embodiment of the present invention, according to variant 2: having a trench-Schottky-barrier-Schottky diode having an integrated pn diode as clamping element (TSBS-pn) having a barrier oxide and p-doped silicon or polysilicon in the lower region of the trenches (TSBS-BOpn).

As shown in FIG. 3, the difference from Variant 1 is that, in variant 2 an oxide layer 8 is introduced between first metal 5 and the sidewalls of trenches 3. With that, an additional barrier-oxide structure (trench-MOS structure) is implemented. That is why this variant is given the name TSBS-BOpn. Oxide thickness To now also belongs to the important structural parameters.

Second metal 6 having the lower barrier, as in variant 1, provides the lower forward voltage. The pn junction at the trench floor determines the breakdown voltage and is used as clamping element.

An advantage of variant 2 over variant 1 is, on the one hand, a better screening effect and therefore a lower blocking-state current. This advantage is conditioned upon the trench-MOS structure, which now replaces the lower Schottky contact. With increasing barrier height of metal 5, this effect is increased somewhat more.

Variant 2 includes an MOS structure, but within the sensitive oxides and in the adjacent Si region, no great field strength appears. Therefore, in the case of a TSBS-BOpn, one does not have to be afraid of the injection of "hot" charge carriers.

As a result, TSBS-BOpn is robust like a pn diode, and is quite suitable for operation as a Z diode.

Manufacturing Method of TSBS-pn (TSBS-BOpn), Variant 2:

Step 1: monocrystalline $n^+$ substrate is used as starting material.

Step 2: n-doped layer 2 is applied in an epitaxy method.

Step 3: trenches 3 are etched using trench etching.

Step 4: filling in trenches 3 using p-doped Si or poly-Si.

Step 4: partial etching of the p-doped Si or poly-Si in trenches 3.

Step 5: oxidation of the surface of trenches 3.

Step 6: etching of the oxides on the floor and at the sidewalls of trenches 3 to a specified height.

Step 7: filling in trenches 3 with first metal 5.

Step 8: if necessary, etching of the first metal down to a specified thickness.
Step 9: filling in the rest of trenches 3 with second metal 6.
Step 10: metallization on the back surface of the chip.

Both variant 1 and variant 2 may have additional structures in the edge region, for the reduction of the fringing field strength. These may be, for example, low-doped p regions, magnetoresistors, etc., e.g., corresponding to conventional arrangements.

What is claimed is:

1. A semiconductor device, comprising:
   a trench-Schottky-bather-Schottky diode; and
   an integrated pn diode arranged as a contact element;
   wherein:
   an n silicon epilayer is located on an n+ substrate and is used as a cathode zone;
   in two-dimensional representation, at least two etched-in trenches are located in the n silicon epilayer, and their lower regions are filled in using at least one of (a) p-doped Si and (b) poly-Si, and are used as the anode zone of the pn diode;
   a depth of the trenches is greater than a width of silicon regions located between the trenches;
   a first metal fills in the trenches up to a specified height, having ohmic contact to the at least one of (a) the p-doped Si and (b) the poly-Si, and having Schottky contact to the n silicon epilayer and arranged as an anode electrode; and
   a second metal fills in a rest of the trenches, having Schottky contact to the n silicon epilayer and arranged as an anode electrode.

2. The semiconductor device according to claim 1, wherein the trench-Schottky-barrier-Schottky diode having the integrated pn diode is made up of a combination of a Schottky diode having a lower barrier height, a Schottky diode having a higher barrier height and a pn diode.

3. The semiconductor device according to claim 2, wherein a breakdown voltage of the pn diode is less than a breakdown voltage of the Schottky diodes.

4. The semiconductor device according to claim 1, wherein the semiconductor device is arranged as a Zener diode having a breakdown voltage of approximately 20 volts.

5. The semiconductor device according to claim 1, wherein there is a metallic layer on a back surface of the semiconductor device arranged as a cathode electrode.

6. The semiconductor device according to claim 1, wherein the trenches are manufactured by etching in the n silicon epilayer and have at least one of (a) a rectangular shape and (b) a U-shape.

7. The semiconductor device according to claim 1, wherein no charge compensation prevails between the n silicon epilayer and the p zone, and a breakdown of the pn diode takes place on a floor of p trenches.

8. The semiconductor device according to claim 1, wherein there is an oxide layer between the first metal and sidewalls of the trenches.

9. The semiconductor device according to claim 1, wherein the trenches are arranged at least one of (a) in a strip arrangement and (b) as islands, the islands at least one of (a) circular and (b) hexagonal.

10. The semiconductor device according to claim 1, wherein the semiconductor device is arranged as a component of a rectifier for a generator in a vehicle and is operable as a Z diode.

* * * * *